United States Patent [19]

Amann et al.

[11] Patent Number: 4,656,636
[45] Date of Patent: Apr. 7, 1987

[54] METHOD FOR MANUFACTURING OF INTEGRATED DFB LASER WITH COUPLED STRIP WAVEGUIDE ON A SUBSTRATE

[75] Inventors: Markus-Christian Amann, Munich; Hans F. Mahlein, Unterhaching; Bernhard Stegmueller, Augsburg; Wolfgang Thulke, Munich; Gerhard Winzer, Putzbrunn; Ulrich Wolff, Munich, all of Fed. Rep. of Germany

[73] Assignee: Siemens Aktiengesellschaft, Berlin and Munich, Fed. Rep. of Germany

[21] Appl. No.: 810,611

[22] Filed: Dec. 23, 1985

Related U.S. Application Data

[63] Continuation of Ser. No. 784,673, Oct. 3, 1983, abandoned.

[30] Foreign Application Priority Data

Oct. 3, 1984 [DE] Fed. Rep. of Germany ....... 3436306

[51] Int. Cl.$^4$ .................... H01S 3/19; H01L 21/00; H01L 21/306; B44C 1/22
[52] U.S. Cl. .................... 372/50; 29/569 L; 29/576 E; 29/580; 148/175; 156/649; 156/652; 156/655; 156/662; 357/17; 357/30; 357/56; 357/91
[58] Field of Search ............ 156/649, 652, 655, 659.1, 156/656, 661.1, 662; 29/569 L, 580, 576 J, 576 E; 148/175, 1.5, DIG. 83; 372/10, 12, 30, 50, 46, 49; 357/16, 17, 30-32, 56, 91, 65; 350/96.1, 96.11, 96.15

[56] References Cited

U.S. PATENT DOCUMENTS

| | | | |
|---|---|---|---|
| 4,178,604 | 12/1979 | Nakamura et al. | 29/569 L |
| 4,257,011 | 3/1981 | Nakamura et al. | 29/569 L |
| 4,575,919 | 3/1986 | Logan | 29/569 L |

OTHER PUBLICATIONS

"A Frequency-Multiplexing Light Source with Monolithically Integrated Distributed-Feedback Diode Laser," Aiki et al, IEEE Journal of Quantum Electronics, vol. QE-13, No. 4, Apr. 1977.

Primary Examiner—William A. Powell

[57] ABSTRACT

A method for integrating a DFB laser and a passive strip waveguide on a substrate. A layer stack is produced in a first epitaxy step, the layer stack having a laser-active layer and a surface-wide grating on the uppermost layer, and eroding the stack area-wise, but only down to a layer under the laser-active layer, not down to the substrate, by means of etching to create a step separating the laser region from the passive strip waveguide region. By employing an etching stop layer, the etching can ensue self-adjustingly, and the coupling between the laser-active layer and the passive strip waveguide region occurs not by end coupling, but by surface coupling. Only two epitaxy steps are required for the complete manufacture of the structure, and a strip required for the definition of the laser and of the waveguide can be produced in the same single method step.

22 Claims, 4 Drawing Figures

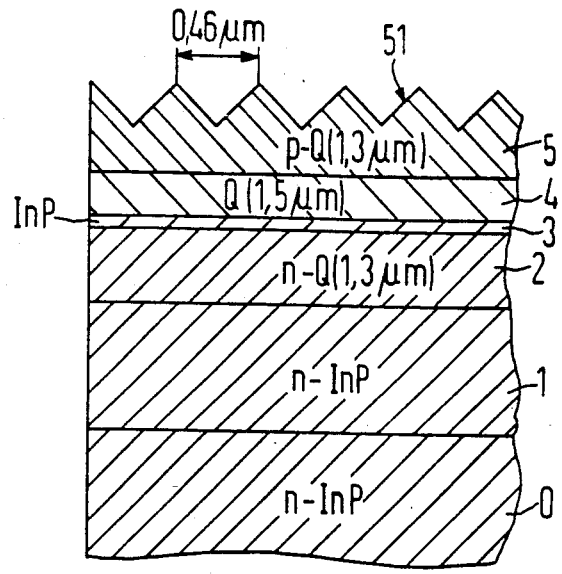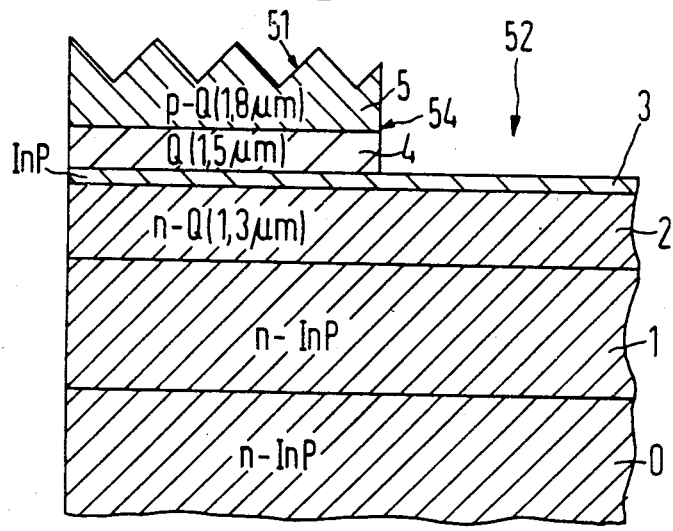

METHOD FOR MANUFACTURING OF INTEGRATED DFB LASER WITH COUPLED STRIP WAVEGUIDE ON A SUBSTRATE

RELATED APPLICATION

This application is a continuation of application Ser. No. 784,673 filed Oct. 3, 1985, now abandoned. The subject matter of this application is related to the subject matter of copending application Ser. No. 812,468 filed Dec. 23, 1985 naming Dr. Manfred Plihal, Dr. Heinrich Schlotterer and Dr. Peter Trommer as inventors.

BACKGROUND OF THE INVENTION

1. Field of the Invention

The present invention lies in the field of techniques for integrating at least one distributed feedback (DFB) semiconductor laser and a passive strip waveguide.

2. Description of the Prior Art

A method for integrating a DFB laser coupled with a passive strip waveguide on a substrate is disclosed in IEEE Journal of Quan. Electronics, Vol. QE-13, No. 4, April 1977, pp. 220–223. By this method, in a first epitaxy step, an n-$Ga_{1-x}Al_xAs$ layer forming the more deeply disposed layer (for example, having $x=0.3$ and a thickness of 2 $\mu m$), a p-GaAs layer forming the laser-active layer (for example, having a thickness of 0.2 $\mu m$), a p-$Ga_{1-y}Al_yAs$ layer (for example, having $y=0.2$ and a thickness of 0.1 $\mu m$), and a p-$Ga_{1-z}Al_zAs$ layer forming the uppermost layer (for example, having $z=0.07$ and a thickness of 0.2 $\mu m$), are successively grown on an n-GaAs substrate by means of conventional liquid phase epitaxy. A third order grating is produced on the uppermost layer of this layer stack by means of chemical etching with the assistance of a mask which has been produced by the use of holographic photolithography. With the exception of the region of the DFB laser, the layer stack is then chemically etched away down to the substrate, thus producing a step extending down into the substrate which separates the region of the laser-active layer from the region of the passive strip waveguide.

Two further layers, that is a p-$Ga_{1-x}Al_xAs$ layer (for example, having $x=0.3$ and a thickness of 2 $\mu m$), and an undoped $Ga_{1-w}Al_wAs$ layer (for example, having $w=0.1$ and a thickness of 2 $\mu m$), are then grown on the stepped surface in the second epitaxy step by means of liquid phase epitaxy under relatively fast growth conditions. The p-$Ga_{1-x}Al_xAs$ layer, which is developed as the first of the two layers, is grown within a time span of 90 seconds at 700° C. with a cooling rate of 5° C./minute. Under these conditions, the p-$Ga_{1-x}Al_xAs$ layer splits or cracks in the step allowing the laser output power to be effectively conducted to the undoped $Ga_{1-w}Al_wAs$ layer, thus forming the passive strip waveguide.

The long-side boundaries of the laser-active region and of the passive strip waveguide region are produced by etching the crystal away down to the substrate. The coupling between the DFB laser and the passive strip waveguide ensues by means of an end face coupling.

As may be seen from FIGS. 2 and 3 on page 221 of the above cited publication, the location of the splitting or cracking of the first layer grown during the second epitaxy step is critical because the split must be formed as precisely as possible at the location of the laser-active layer. The position of this split can only be controlled via the growth conditions utilized during the second epitaxy step.

It is a problem in the art to provide a method for integrating a DFB laser with a passive strip waveguide on a substrate so that DFB lasers coupled with passive strip waveguides can be reproducibly manufactured resulting in a high yield. Such a method needs to guarantee the exact alignment of the DFB laser and the passive strip waveguide relative to one another.

BRIEF SUMMARY OF THE INVENTION

The present invention relates to an improved method for integrating at least one distributed feedback semiconductor laser with a passive strip waveguide on a substrate. In a first epitaxy step, a layer stack having a laser-active layer and a surface-wide grating on its uppermost layer is produced. The stack is eroded areawise down to a layer located under the laser-active layer but above the substrate and etching is employed to create a step separating the laser region from a passive step waveguide region. An etching stop layer causes the etching procedure to proceed in a self-adjusting manner, and the coupling between the laser-active layer and the passive strip waveguide region occurs by surface coupling (not end coupling). The invention further relates to the integrated structure so produced.

One feature is that only two epitaxy steps are required for complete manufacture of the structure.

Another feature is that a strip required for a definition of the laser region and for the waveguide region can be produced in a single method step.

It is an object of the present invention to provide a method for integrating a DFB laser and a passive strip waveguide on a substrate with which DFB lasers coupled with passive strip waveguides can be reproducibly manufactured on a substrate, thus, for example, resulting in a high yield.

It is a further object of the present invention to provide a method for integrating a DFB laser and a passive strip waveguide that will guarantee that the DFB laser and the passive strip waveguide will be in exact alignment with one another.

In accordance with the foregoing features and objectives, the method of this invention departs from the conventional use of end face coupling between the DFB laser and the passive strip waveguide. Instead, this invention utilizes surface coupling between a DFB laser and a passive strip waveguide. Consequently, a coupling is provided wherein radiation is not coupled over the mutually facing end faces of the laser-active layer and of the layer-like strip waveguide, but, instead, the radiation is laterally coupled over via the opposite surfaces of the laser-active layer and of the layer-like strip waveguide. Thus, it is no longer necessary to produce, as in the prior art, a split or crack in the first layer grown during the second epitaxy step, thereby eliminating the difficulties connected therewith.

In the present invention, the erosion of the layer stack is stopped at a defined location. This defined location, is less critical than the location of the split in the prior art because only the thickness of the more deeply disposed layer provided for the strip waveguide is deteriorated if the erosion is not stopped exactly on time. This thickness is relatively uncritical and the etching processes suitable for the erosion can be relatively precisely controlled.

A particular advantage of the method of the present invention is that the erosion of the layer stack down to a defined depth can be observed very precisely without great difficulty. Also, by producing a relatively thin etching stop layer, disposed between the most deeply disposed layer and the laser-active layer in the first epitaxy step, the erosion of the layer stack becomes practically self-adjusting.

Other and further objects, purposes, advantages, aims, utilities, features and the like will be apparent to those skilled in the art from a reading of the present invention taken together with the drawings.

BRIEF DESCRIPTION OF THE DRAWINGS

In the drawings:

FIG. 1 is a cross-sectional view taken longitudinally through a substrate of one embodiment of the invention showing the layer stack applied in a first epitaxy step having a corrugated uppermost layer;

FIG. 2 is a view similar to FIG. 1, but wherein the step has already been introduced into the layer stack;

DESCRIPTION OF THE PREFERRED EMBODIMENTS

Figure 3:
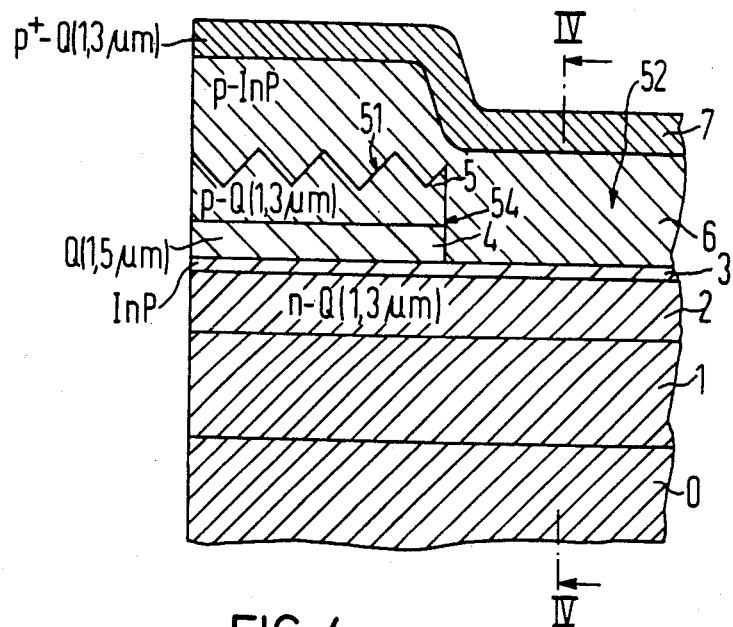
FIG. 3 is a view similar to FIG. 2, but wherein the two further layers have been applied by the second epitaxy step.

As illustrated in FIG. 1, a buffer layer 1, (being, for example, an n-InP layer), a more deeply disposed layer 2, (being, for example, an n-Q layer having, for example, a thickness of 0.3 $\mu$m and a band gap corresponding to a fluorescence wavelength of 1.3 $\mu$m), a relatively thin etching stop layer 3, (being, for example, an InP layer 0.1 $\mu$m thick), a laser-active layer 4, (being, for example, a Q-layer 0.2 $\mu$m thick and having a band gap corresponding to 1.5 $\mu$m), and an uppermost layer 5, (being, for example, a p-Q-layer 0.3 $\mu$m thick and having a band gap corresponding to 1.3 $\mu$m), are successively applied to the substrate 0 (being, for example an n-InP substrate), by liquid phase epitaxy. These respective layers can be epitaxially generated in immediate succession and without interruption, that is, in a single continuous epitaxy step. The term "Q-layer" is used herein to refer to a quarternary layer, that is, a layer of a quarternary compound. A general example of such a compound is InGaAsP, whereby indexes have been omitted.

A grating 51 (for example, one having a grating constant of 0.46 $\mu$m,) is etched surface-wide into the uppermost layer 5. The grooves of grating 51 run perpendicular to the longitudinal direction of the strip waveguide, that is, perpendicularly to the plane of the drawing. The uppermost layer 5 and the laser-active layer 4 are etched off in a right-hand region 52 (in the drawing) of the substrate down to the etching stop layer 3. This forms the step 54 which is best observed in FIG. 2.

In a second epitaxy step, an additional first-applied layer 6 (being, for example, a p-InP layer having, for example, a thickness of 1.5 $\mu$m), and an added second-applied layer 7, (being, for example, a p+-Q layer having, for example, a thickness of 0.3 $\mu$m), are applied surface-wide to the stepped surface as illustrated in FIG. 3.

Figure 4:
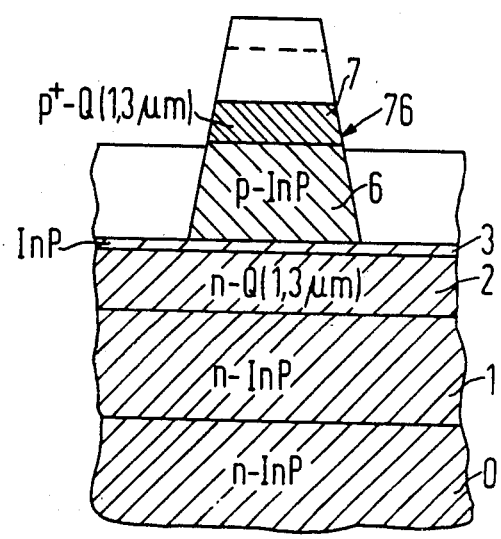
FIG. 4 is a cross-sectional view similar to FIG. 3 but showing the completed member.

By means of selective etching, the respective layers 6 and 7 are etched off except for a strip 76 (see FIG. 4) proceeding transversely over the step 54, the resulting strip 76 covering both the grating 51 as well as the remaining, more deeply disposed layer 2. This strip 76 defines the respective long-side boundaries of both the DFB laser laying in the region of the laser-active layer 4 and of the grating 51, as well as that of the passive strip waveguide. The radiation is essentially conducted under this strip 76, namely, both in the laser-active layer 4 as well as in the more deeply disposed layer 2 which latter layer, together with the strip 76, defines the passive strip waveguide. The buffer layer 1 adjoining the more deeply disposed layer 2 from below, and the first applied layer 6 lying above the more deeply disposed layer 2 must, together with the etching stop layer 3, have a lower refractive index than the more deeply disposed layer 2 in order for this combination to act as a waveguide. This requirement is met given the selected materials cited above by way of example.

Finally, the second applied layer 7 must be present only over the region of the laser, that is, over the laser-active layer 4 and the grating 51. Therefore, it can be removed outside of this region. A metal layer required for the operation of the laser is applied to the second applied layer 7 as a contact.

Although other modifications and changes may be suggested by those skilled in the art, it is the intention of the inventors to embody within the patent warranted hereon all changes and modifications as reasonably and properly come within the scope of their contribution to the art.

We claim:

1. An integrated structure on a substrate comprising in sequence:
    a first layer disposed above and closest to said substrate;
    a laser-active layer disposed above and partially overlapping said first layer;
    a second layer disposed adjacent and coextensive with said laser-active layer and having an upper surface with a grating therein;
    a third layer disposed adjacent said second layer and partially overlapping said first layer beyond said laser-active layer;
    a fourth layer disposed adjacent and coextensive with said third layer;
    said laser-active layer, said second layer, said third layer and said fourth layer forming a transverse strip structure above said first layer operable as a laser; and
    said substrate, said laser-active layer and said third layer having a higher refractive index than said first layer, said laser-active layer being disposed close enough to said first layer to establish optical coupling therebetween, and said first layer having a selective thickness such that said first layer is operable as a strip waveguide.

2. An integrated structure as claimed in claim 1 further comprising a buffer layer disposed between said substrate and said first layer, said buffer layer having a higher refractive index than said first layer.

3. An integrated structure as claimed in claim 1, further comprising an etch-stop layer disposed between said first layer and said laser-active layer and between said first layer and said third layer, said etch stop layer having a higher refractive index than said first index.

4. An integrated structure as claimed in claim 3, wherein said etch stop layer is an InP layer.

5. An integrated structure as claimed in claim 1, wherein said third layer is a P-doped layer and wherein said fourth layer is a P+ doped layer.

6. An integrated structure as claimed in claim 1, wherein said third layer is an InP layer.

7. An integrated structure as claimed in claim 1, wherein said fourth layer is an quaterny layer.

8. An integrated structure as claimed in claim 1, wherein said second layer is a quaterny layer.

9. An integrated structure as claimed in claim 1, wherein said laser-active layer is a quaterny layer.

10. An integrated structure as claimed in claim 1, wherein said first layer is a quaterny layer.

11. An integrated structure as claimed in claim 1, wherein said first layer is n-doped and wherein said second layer is p-doped.

12. A method for manufacturing an integrated structure on a substrate comprising in sequence the steps of:
   generating a first layer above and closest to said substrate having an index of refraction which is lower than the index of refraction of said substrate and having a thickness for permitting said first layer to operate as a strip waveguide;
   generating a laser-active layer having a refractive index greater than the refractive index of said first layer disposed above and close enough to said first layer to establish optical coupling therebetween;
   generating a second layer above said laser-active layer;
   selectively removing coextensive portions of said laser-active layer and said second layer for generating a step structure overlying a portion of said first layer;
   generating a grating in an upper surface of said second layer;
   generating a third layer over said second layer and overlying said first layer beyond said step structure having a refractive index greater than the refractive index of said first layer;
   generating a fourth layer above said third layer; and
   removing selected substantially coextensive portions of said third and fourth layers beyond said step structure thereby generating a transverse strip operable as a laser disposed above said first layer.

13. A method as claimed in claim 12, wherein said first layer, said laser-active layer and said second layer are generated in a single epitaxy step.

14. A method as claimed in claim 12, wherein said third layer and said fourth layer are generated in a single epitaxy step.

15. A method as claimed in claim 12, comprising the additional step of generating an etch-stop layer immediately after generating said first layer disposed adjacent said first layer, and wherein the steps of removing selected portions of said laser-active and second layers and removing selected portions of said third and fourth layers are done by etching.

16. A method as claimed in claim 12, comprising the additional step of:
   generating a buffer layer on said substrate before generating said first layer.

17. A method as claimed in claim 12, wherein said first layer is a quaterny layer.

18. A method as claimed in claim 12, wherein said laser-active layer is a quaterny layer.

19. A method as claimed in claim 12, wherein said second layer is a quaterny layer.

20. A method as claimed in claim 12, comprising the additional steps of:
   n-doping said first layer; and
   p-doping said second layer.

21. A method as claimed in claim 12, wherein said third layer is an InP layer.

22. A method as claimed in claim 12, comprising the additional steps of:
   p-doping said third layer; and
   $p^+$ doping said fourth layer.

* * * * *